US011231995B2

(12) United States Patent
Kaynak et al.

(10) Patent No.: US 11,231,995 B2
(45) Date of Patent: *Jan. 25, 2022

(54) PROVIDING DATA OF A MEMORY SYSTEM BASED ON AN ADJUSTABLE ERROR RATE

(71) Applicant: Micron Technology, Inc., Boise, ID (US)

(72) Inventors: Mustafa N. Kaynak, San Diego, CA (US); Larry J. Koudele, Erie, CO (US); Michael Sheperek, Longmont, CO (US); Patrick R. Khayat, San Diego, CA (US); Sampath K. Ratnam, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/746,786

(22) Filed: Jan. 17, 2020

(65) Prior Publication Data

US 2020/0151058 A1  May 14, 2020

Related U.S. Application Data

(63) Continuation of application No. 15/914,402, filed on Mar. 7, 2018, now Pat. No. 10,540,228.

(51) Int. Cl.
*G06F 11/10* (2006.01)
*G06F 3/06* (2006.01)
*G11C 29/52* (2006.01)

(52) U.S. Cl.
CPC ........ *G06F 11/1068* (2013.01); *G06F 3/0619* (2013.01); *G06F 3/0659* (2013.01); *G06F 3/0679* (2013.01); *G11C 29/52* (2013.01)

(58) Field of Classification Search
CPC .. G06F 11/1068; G06F 3/0619; G06F 3/0659; G06F 3/0679; G11C 29/52
See application file for complete search history.

(56) References Cited

U.S. PATENT DOCUMENTS 8,484,519 B2  7/2013  Weathers et al.
9,496,043 B1  11/2016  Camp et al.
(Continued)

FOREIGN PATENT DOCUMENTS

KR   1020150130633   11/2015
KR   10-2018-0009430 A   1/2018

OTHER PUBLICATIONS

International Search Report and Written Opinion for International Patent Application Serial No. PCT/US2019/0021239, dated Jul. 11, 2019, 10 pages.
(Continued)

*Primary Examiner* — Kyle Vallecillo
(74) *Attorney, Agent, or Firm* — Lowenstein Sandler LLP

(57) ABSTRACT

A first data stored at a first portion of a memory cell and a second data stored at a second portion of the memory cell are identified. A first error rate associated with first data stored at the first portion of the memory cell is determined. The first error rate is adjusted to exceed a second error rate associated with the second data stored at the second portion of the memory cell. A determination is made as to whether the first error rate exceeds a threshold. The second data stored at the second portion of the memory cell is provided for use in an error correction operation by a controller associated with the memory cell in response to determining that the first error rate exceeds the threshold.

21 Claims, 6 Drawing Sheets

(56) References Cited

U.S. PATENT DOCUMENTS

| | | |
|---|---|---|
| 2008/0137415 A1 | 6/2008 | Lee |
| 2008/0276150 A1 | 11/2008 | Kong et al. |
| 2009/0109748 A1* | 4/2009 | Cho .................... G11C 11/5628 |
| | | 365/185.03 |
| 2009/0287969 A1 | 11/2009 | White et al. |
| 2012/0240007 A1 | 9/2012 | Barndt et al. |
| 2014/0164870 A1 | 6/2014 | Sun et al. |
| 2014/0301142 A1 | 10/2014 | Stoev et al. |
| 2015/0199268 A1 | 7/2015 | Davis et al. |
| 2016/0041891 A1* | 2/2016 | Malshe ............... G06F 11/1048 |
| | | 714/704 |
| 2016/0218740 A1* | 7/2016 | Parthasarathy ..... G06F 11/1068 |
| 2017/0075756 A1 | 3/2017 | Noguchi et al. |
| 2017/0102991 A1 | 4/2017 | Haratsch et al. |
| 2017/0213597 A1* | 7/2017 | Micheloni .............. G11C 16/12 |
| 2017/0255403 A1* | 9/2017 | Sharon ................ G11C 11/5642 |
| 2017/0345510 A1* | 11/2017 | Achtenberg ........... G11C 29/52 |
| 2019/0097132 A1* | 3/2019 | Rajamohanan ..... H01L 29/1033 |
| 2019/0332467 A1* | 10/2019 | Ross ....................... G06F 17/16 |

OTHER PUBLICATIONS

Extended European Search Report Serial No. EP 19 76 3489, dated Nov. 1, 2021, 10 pages.

\* cited by examiner

PROVIDING DATA OF A MEMORY SYSTEM BASED ON AN ADJUSTABLE ERROR RATE

RELATED APPLICATIONS

This application is a continuation application of co-pending U.S. patent application Ser. No. 15/914,402, filed Mar. 7, 2018, which is herein incorporated by reference.

TECHNICAL FIELD

The present disclosure generally relates to a memory system, and more specifically, relates to providing data of a memory system based on an adjustable error rate.

BACKGROUND

A memory system can be a storage system, such as a solid-state drive (SSD), and can include one or more memory components that store data. For example, a memory system can include memory devices such as non-volatile memory devices and volatile memory devices. In general, a host system can utilize a memory system to store data at the memory devices of the memory system and to retrieve data stored at the memory system.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
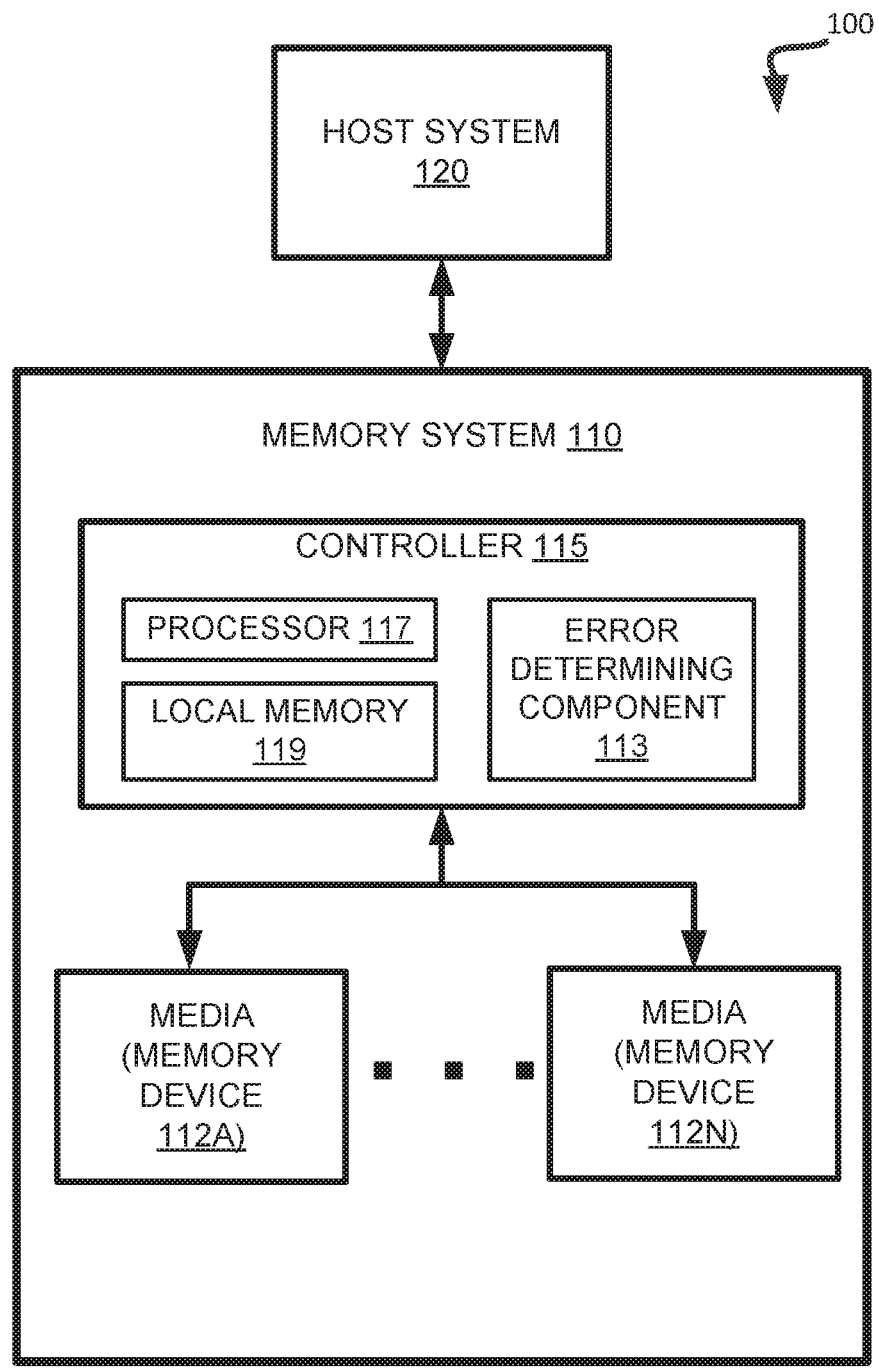
FIG. 1 illustrates an example computing environment that includes a memory system in accordance with some embodiments of the present disclosure.

Aspects of the present disclosure are directed to providing data of a memory system based on an adjustable error rate. An example of a memory system is a storage system, such as a solid-state drive (SSD). In some embodiments, the memory system is a hybrid memory/storage system. In general, a host system can utilize a memory system that includes one or more memory devices. The memory devices can include non-volatile memory devices, such as, for example, negative-and (NAND). The host system can provide data to be stored at the memory system and can request data to be retrieved from the memory system.

The memory system can store the data at memory cells of a memory device included in the memory system. Each of the memory cells can store one or more bits of binary data corresponding to the data received from the host system. The memory device can include a quad-level cell (QLC) memory. In QLC memory, each memory cell can store four bits of data. For example, in a QLC memory, a memory cell can store four bits of data (e.g., 1111, 0000, 1101, etc.) corresponding to data received from the host system. Each bit of the memory cell is stored at a different portion (also referred to as "page" hereafter) of the memory cell. A memory cell of the QLC memory can have a total of four pages. For example, the memory cell can include a lower page (LP), an upper page (UP), an extra page (XP) and a top page (TP), where each page stores a bit of data. For example, a bit can be represented by each of the four pages of the memory cell. In a memory cell for a QLC memory, each combination of four bits can correspond to a different voltage level (also referred to as "level" hereafter). For example, a first level of the memory cell can correspond to 1111, a second level can correspond to 0111, and so on. Because a memory cell for a QLC memory includes 4 bits of data, there are a total of 16 possible combinations of the four bits of data. Accordingly, a memory cell for a QLC memory can be programmed to one of 16 different levels.

Generally, the memory system receives a request from a host system to perform a programming operation to store data at the QLC memory. A controller of the memory system can store the data by performing a two-pass programming operation on the memory cells of the memory system. During a first programming pass of the two-pass programming operation, the controller programs a number of pages to a memory cell. For example, the controller can apply a voltage level to the memory cell to program three pages of data from the host system to the memory cell. The second programming pass can then be performed on the memory cell.

The second programming pass programs the last page of the memory cell. The level that the memory cell is programmed to in the second programming pass can be based on the last page of the memory cell as well as the prior pages that were programmed at the memory cell in the first programming pass. Therefore, if data stored at any of the pages of the memory cell during the first programming pass includes an error and the error is not corrected before the second programming pass is performed on the memory cell, then the memory cell will be programmed to the wrong level (also referred to as "level misplacement" hereafter), resulting in an increased error rate for the data stored at the memory cell. These types of errors can be considered as write-in errors, where the wrong data is written to the memory cell. Level misplacements can result in high reliability errors of the data stored at the memory cell, which can deteriorate the performance of the memory system if a large number of error correction operations are to be performed. Accordingly, after programming the first three of the four portions of a memory cell of a QLC memory during the first programming pass, in the second programming pass the memory system can determine whether data stored at the first three portions includes an error by providing the data to the controller. In one example of a conventional memory system, a read operation is performed on the three portions of the memory cell during the second programming pass. For example, the controller performs the read operation on data at the three pages of the memory cell that was programmed during the first programming pass. The read operation is used to correct the bit errors at any of the pages and determine the corresponding error rate associated with the data stored at the memory cell. Thus, when a conventional memory system provides the three pages associated with the first pass to the controller, then second pass programing of the conventional memory system can be performed using the last page provided by the host system and the three corrected pages at the controller. This can result in no level misplacement or a reduced level misplacement. The corrected data can be programmed to the memory cell along with data to be programmed to the remaining page of the memory cell that is received from the host system during the second programming pass. However, an interface used by the controller of the memory system can be shared between multiple memory devices that include memory cells. The interface can have a limited bandwidth that is available for input/output (TO) operations performed by the controller on the memory devices. Accordingly, performing IO operations that utilize a large amount of the bandwidth, such as the read operations on the three pages of multiple memory cells associated with the first programming pass, can result in a saturation of the interface (e.g., the bandwidth of IO operations exceeds the available bandwidth of the interface). In one example of a conventional memory system, the data stored at all three pages of the memory cell are read internally and stored locally at a buffer of the memory device without providing the data to the controller via the interface. In such an example, the first programming pass includes three IO operations (one IO operation per page) and the second programming pass includes one IO operation to program the remaining page for a total of four IO operations being performed via the interface. While such an example can reduce the number of IO operations being performed via the interface, the probability of level misplacement increases by not providing any of the data of the first programming pass to the controller for error correction.

In another example of a conventional memory system, the data stored at all three pages of the first programming pass is sent to the controller via the interface. In such an example, the first programming pass includes three IO operations to program the first three pages and providing the data stored at all three pages to the controller utilizes another three IO operations. The second programming pass includes four IO operations (e.g., 3 IO operations for the three pages provided to the controller and 1 IO operation to program data received from the host system to the remaining page), resulting in a total of 10 IO operations being performed via the interface. This increased number of IO operations performed via the interface can cause a bottleneck of IO operations at the interface that can be performed at the rate of available bandwidth of the interface, resulting in an increase in latency and a decrease in performance of the memory system.

Alternatively, in another example of a conventional memory system, rather than the memory system performing a read operation on the data stored at the three portions of the memory cell, the data stored at the three portions can additionally be stored locally on a buffer memory of a controller of the memory system during the first programming pass to reduce the number of IO operations being performed via the interface. In such an example, the first programming pass includes three IO operations to program the first three pages and the second programming pass includes four IO operations (e.g., 3 IO operations for the three pages stored locally on the buffer of the controller and 1 IO operation to program data received from the host system to the remaining page), resulting in a total of 7 IO operations being performed via the interface. However, storing the data locally on the controller can result in additional components being added to the controller, such as a buffer memory to store the data provided to the memory cell. This can result in an increase in the cost and complexity of the memory system.

Aspects of the present disclosure address the above and other deficiencies by providing data to a controller based on an error rate. The first data stored at the first portion of the memory cell is provided to a controller of the memory system. The controller first corrects any errors at the first data and determines an error rate associated with the first data. The first data may be data from a particular page of a group of pages that was programmed during a first programming pass The controller determines whether the error rate associated with the first data exceeds a threshold. In one embodiment, the error rate associated with the first page can be used as a proxy for other data from the other two pages that was programmed during the first programming pass. This use of the error rate of the first page as a proxy for the other data from the other pages programmed during the first programming pass can be utilized in the second programming pass. For example, the three pages programmed during the first programming pass can have similar error and disturb mechanisms. Therefore, an elevated error rate for the first page can also indicate an elevated error rate for the data at the other two pages programmed in the first programming pass. Because the first data stored at the first portion of the memory cell (e.g., the first page) is programmed during the first programming pass with the second data at the second portion (e.g., the second page), the error rate of the first data can be used to determine whether the second data likely includes an error. For example, if the error rate exceeds the threshold, indicating a relatively high error rate associated with the first data, then the second data stored at the memory cell can also have a relatively high error rate. Accordingly, if the memory system determines that the error rate exceeds the threshold, then the second data stored at the second portion of the memory cell is provided to the controller of the memory system for error correction. Such a process can ensure that first and second pages will not include level misplacement when the second programming pass is performed.

Thus, providing data to a controller based on determined error rates can result in improved system performance of the memory system by providing second data from a second portion of the memory cell to a controller when an error rate of first data at a first portion of memory cell exceeds a threshold. Accordingly, the number of TO operations being performed via the interface of the memory system can be reduced by providing the second data via the interface when the error rate exceeds a threshold and the occurrence of bottlenecks at the interface caused by the TO operations can be reduced or eliminated. Furthermore, additional components, such as a buffer memory for the storage of data (e.g., first data and second data), are not added to the controller. Additionally, the number of level misplacements is reduced because data stored at pages having a high error rate are provided to the controller for error correction. As a result, the performance of the storage device can be improved by decreasing the latency of the storage device without the addition of hardware components to the memory controller. Although the present examples describe providing data to a controller based on determined error rates during a second programming pass of a memory cell of a QLC memory, aspects of the present disclosure can be applied to any programming operation of a memory cell of a memory system that includes multiple (e.g., two or more) bits of data. Furthermore, although the present examples describe providing data to a controller based on determined error rates during the second programming pass of a memory cell of QLC memory, aspects of the present disclosure can be applied to any number (e.g., one or more) programming operations for any type of memory.

FIG. 1 illustrates an example computing environment 100 that includes a memory system 110 in accordance with some implementations of the present disclosure. The memory system 110 can include media, such as memory devices 112A to 112N. The memory devices 112A to 112N can be volatile memory devices, non-volatile memory devices, or a combination of such. In some embodiments, the memory system is a storage system. An example of a storage system is a SSD. In general, the computing environment 100 can include a host system 120 that uses the memory system 110. In some implementations, the host system 120 can write data to the memory system 110 and read data from the memory system 110. In some embodiments, the memory system 110 is a hybrid memory/storage system.

The host system 120 can be a computing device such as a desktop computer, laptop computer, network server, mobile device, or such computing device that includes a memory and a processing device. The host system 120 can include or be coupled to the memory system 110 so that the host system 120 can read data from or write data to the memory system 110. The host system 120 can be coupled to the memory system 110 via a physical host interface. As used herein, "coupled to" generally refers to a connection between components, which can be an indirect communicative connection or direct communicative connection (e.g., without intervening components), whether wired or wireless, including connections such as, electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory system 110. The host system 120 can further utilize an NVM Express (NVMe) interface to access the memory devices 112A to 112N when the memory system 110 is coupled with the host system 120 by the PCIe interface. The physical host interface can provide an interface for passing control, address, data, and other signals between the memory system 110 and the host system 120.

The memory devices 112A to 112N can include any combination of the different types of non-volatile memory devices and/or volatile memory devices. An example of non-volatile memory devices includes a negative-and (NAND) type flash memory. Each of the memory devices 112A to 112N can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks) used by the host system 120. Although non-volatile memory devices such as NAND type flash memory are described, the memory devices 112A to 112N can be based on any other type of memory such as a volatile memory. In some implementations, the memory devices 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the memory devices 112A to 112N can be grouped as memory pages or data blocks that can refer to a unit of the memory device used to store data.

The controller 115 can communicate with the memory devices 112A to 112N to perform operations such as reading data, writing data, or erasing data at the memory devices 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory system 110, including handling communications between the memory system 110 and the host system 120. In some embodiments, the local memory 119 can include memory registers storing, e.g., memory pointers, fetched data, etc. The local memory 119 can also include read-only memory (ROM) for storing micro-code. While the example memory system 110 in FIG. 1 has been illustrated as including the controller 115, in another embodiment of the present disclosure, a memory system 110 may not include a controller 115, and may instead rely upon external control (e.g., provided by an external host, or by a processor or controller separate from the memory system).

In general, the controller 115 can receive commands or operations from the host system 120 and can convert the commands or operations into instructions or appropriate commands to achieve the desired access to the memory devices 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory devices 112A to 112N. The controller 115 can further include host interface circuitry to communicate with the host system 120 via the physical host interface. The host interface circuitry can convert the commands received from the host system into command instructions to access the memory devices 112A to 112N as well as convert responses associated with the memory devices 112A to 112N into information for the host system 120.

The memory system 110 can include an error determining component 113 that can be used to determine error rates for data stored at memory cells of the memory system. The error rate can be determined by comparing the data read from the memory cell and comparing it with output data associated with an error correction operation performed on the data. In some embodiments, the controller 111 includes at least a portion of the error determining component 113. The error determining component 113 can determine error rates associated with the data read from the memory. The error rates for the data can correspond to a probability that the data stored at a memory cell includes an error. The error determining component 113 can determine an error rate that is associated with first data stored at a first portion of a memory cell of one of the memory devices 112A-N of the memory system 110. For example, the error determining component 113 can determine the error rate for first data stored at the first page of a memory cell that is provided to the controller. Further details with regards to the operations of the error determining component 113 are described below.

In some implementation, the data structure can be a table or other types of data structures to store the write attributes for memory pages in the first region. In some implementations, the table can include a corresponding entry for each memory page associated with data written to the first region. As data from the host system 120 is received to be stored at the memory devices 112A to 112N, the write attribute handler 113 can receive and store an indication of a temperature measurement taken at the time the data is programmed to the memory devices 112A to 112N. After the pages are programed, the measured temperature is stored on a page in a SLC page in the memory. By storing the write attributes in the SLC page, the controller 115 can determine, for example, whether there is an extreme shift in temperature from when the data was programmed at a memory cell to when it was subsequently read from that memory cell.

The memory system 110 can also include additional circuitry or components that are not illustrated. In some implementations, the memory system 110 can include a cache or buffer (e.g., DRAM) and address circuitry (e.g., a row decoder and a column decoder) that can receive an address from the controller 115 and decode the address to access the memory devices 112A to 112N.

Figure 2:
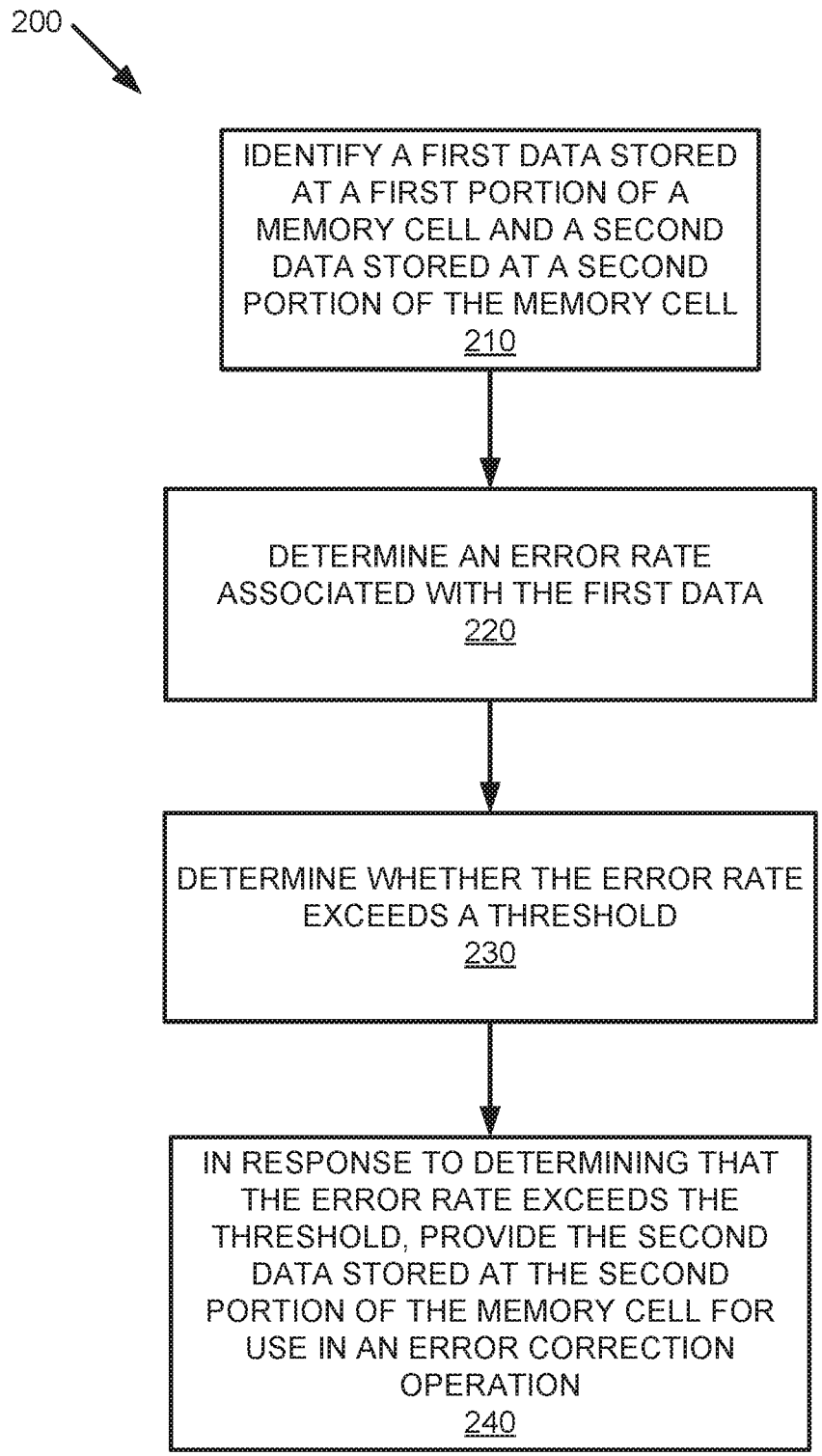
FIG. 2 is a flow diagram of an example method to provide additional data of a memory system based on an adjustable error rate exceeding a threshold in accordance with some embodiments of the present disclosure.

FIG. 2 is a flow diagram of an example method 200 to provide second data to a controller based on an adjusted error rate exceeding a threshold, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 200 is performed by the error determining component 113 of FIG. 1. In another implementation, the method 200 can be performed by a host system (e.g., host system 120 of FIG. 1) having access to modify parameters of the memory device.

At block 210, a processing device identifies a first data stored at a first portion of a memory cell and a second data stored at a second portion of the memory cell. For example, the processing device identifies first data stored at the first page of a memory cell and second data stored at the second page of the memory cell. At block 220, an error rate associated with the first data is determined. In one embodiment, the error rate can be determined by comparing the first data that is provided to the controller with output data of an error correction operation associated with the first data. In embodiments, the error rate can be greater than an expected error rate of the second data. As previously discussed, by having the error rate of the first data be greater than an error rate associated with a second or other data stored at the memory cell, the first data can act as a proxy for the second data. For example, if the first data has a high error rate, then the second data can also be assumed to have a high error rate. Thus, if data at three portions (e.g., pages) of a memory cell are programmed, the error rate of the data at a particular portion of the three portions can be higher than the error rate at the other data at the remaining portions of the three portions of the memory cell.

Accordingly, in some embodiments, the error rate associated with the first data stored at the first portion of the memory cell can be adjusted so that it is greater than the error rate associated with the second data (or any other data programmed during the first programming pass). The adjustment of the error rate can be based on the adjusting of program verify (PV) voltages for corresponding levels of the memory cell. The PV voltage for a particular level corresponds to a target voltage threshold, such each memory cell at the particular level has a voltage threshold that exceeds the PV voltage. For example, if a particular level has a PV voltage of PV1, then the memory cells programmed to the particular level can have a voltage threshold that is greater than PV1. The PV voltages can be adjusted such that a desirable ordering between page error rates can be achieved. The operation to adjust the PV voltages (also referred to as a dynamic programming target (DPT) operation hereafter) can be performed over time. The input of the DPT operation uses page error rates and iteratively adjusts PV voltages associated with particular pages of a memory cell in an iterative process to achieve a desired error rate between different pages of the memory cell. A DPT operation can adjust the PV voltages associated with the memory cell so that a subsequent error rate associated with the first data stored at the memory cell can be expected to be greater than a subsequent error rate associated with the other data stored at the memory cell. For example, the DPT operation can decrease the range of the PV voltage associated with the data stored at the memory cell and/or increase the range of the PV voltage associated with the other data stored at the memory cell to ensure that the subsequent error rate associated with the data is greater than the subsequent error rate associated with the other data. Further detail regarding the adjustment of PV voltages are described below in conjunction with FIGS. 4A and 4B At block 230, the processing device determines whether the error rate exceeds a threshold. The first error rate may be expected to be larger than other error rates for other data stored at the memory cell. In one implementation, a read operation can be performed on the first data stored at the first portion of the memory cell. The first data from the read operation can be provided to a controller of the memory system and the controller can determine whether the error rate for the first data exceeds the threshold. At block 240, in response to determining that the error rate exceeds the threshold, the second data stored at the second portion of the memory cell is provided for use in an error correction operation. For example, the second data stored at the second page of the memory cell that was programmed during the first programming pass is provided to the controller (e.g., controller 111 of FIG. 1) for error correction. In one implementation, the second data stored at the second page of the memory cell can be provided to the controller during a second programming pass of a two-pass programming operation. In some implementations, an error correction operation is performed on the second data, as will be discussed in more detail below. In implementations, third data stored at a third portion of the memory cell can be provided for use in an error correction operation in response to the error rate exceeding a threshold. For example, third data stored at a third page of the memory cell can be provided to the controller. The controller can determine whether the third data includes an error. If the controller determines the third data includes an error, the controller can perform an error correction data on the third data to correct the error.

As such, when an error rate for a particular data stored at a memory cell during a first programming pass exceeds a threshold rate, other data stored at the memory cell during the first programming pass can be retrieved and provided for use in an error correction operation. The error correction operation can be performed on the data stored at the memory cell as part of the second programming pass.

Figure 3:
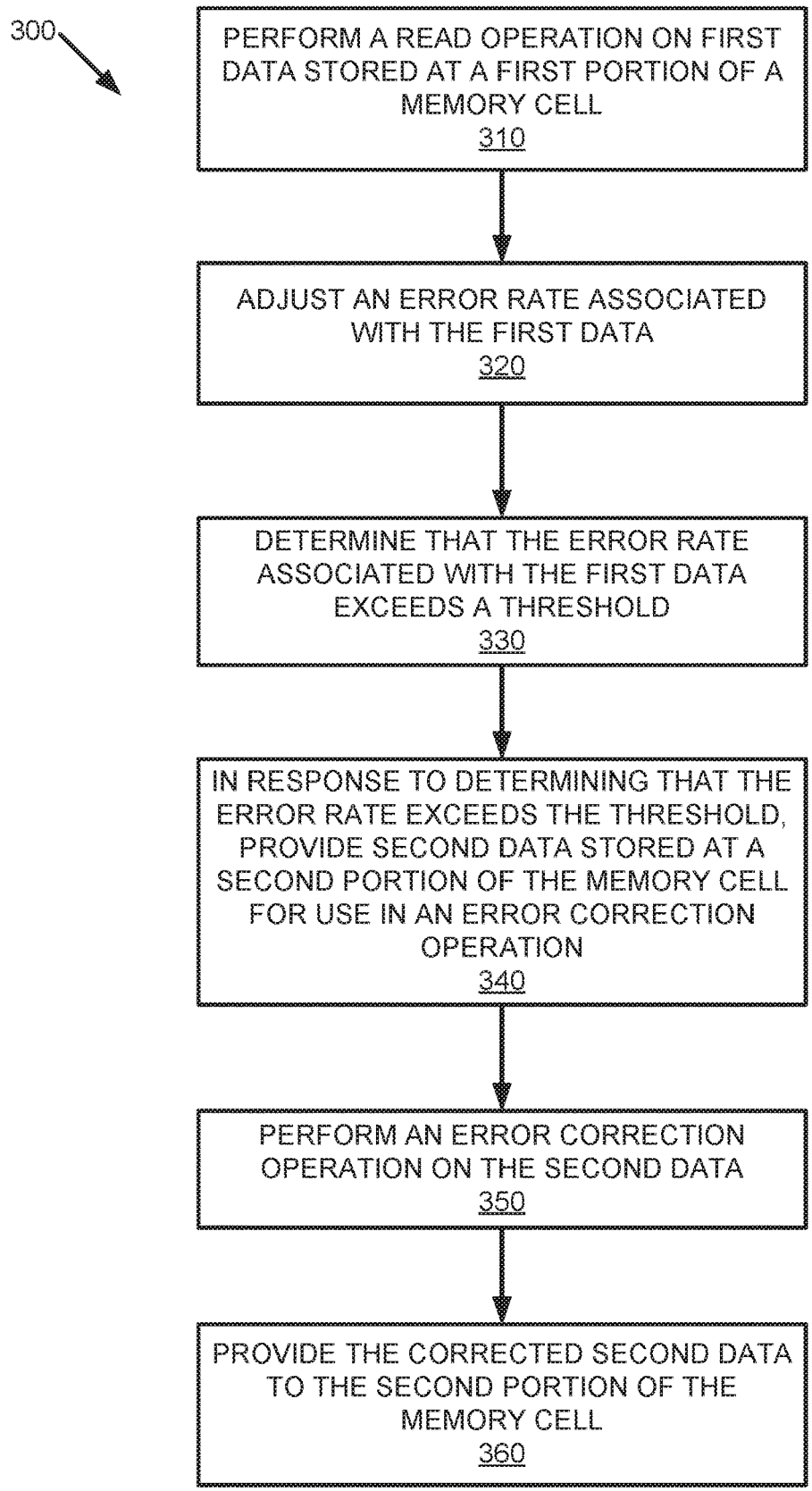
FIG. 3 is a flow diagram of an example method to perform an error correction operation on data based on a read operation performed on another data in accordance with some embodiments of the present disclosure.

FIG. 3 is a flow diagram of an example method 300 to perform an error correction operation on data based on a read operation performed on another data, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some implementations, the method 300 can be performed by the error determining component 113 of FIG. 1. In another implementation, the method 200 can be performed by a host system (e.g., host system 120 of FIG. 1) having access to modify parameters of the memory device.

At block 310, a processing device performs a read operation on first data stored at a first portion of a memory cell. For example, a read operation is performed on first data stored at the first page of a memory cell. At block 320, an error rate associated with the first data stored at a first portion of the memory cell is adjusted to that the error rate associated with the first data is greater than an error rate associated with second data that is stored at a second portion of the memory cell. The error rates can be adjusted by modifying associated PV voltage values, as will be described below. At block 330, an error rate associated with the first data is determined to exceed a threshold. At block 340, in response to determining that the error rate exceeds the threshold, second data stored at a second portion of the memory cell is provided for use in an error correction operation. For example, second data stored at the second page of the memory cell can be provided to the controller for error correction.

At block 350, the error correction operation is performed on the second data. In some implementations, an error-correcting code (ECC) operation or another type of error detection and correction operation can be used to detect and correct the error. For example, if the data read at the first page of the memory cell corresponds to a value of 1, the error can be corrected by changing the value from a 1 to a 0. In implementations, the first data can be determined to include an error. If the first data is determined to include an error, then an error correction operation can be performed on the first data. At block 360, the corrected second data is provided to the second portion of the memory cell. For example, the corrected second data is provided to the second page of the memory cell for storage. In some implementations, the first data or corrected first data is provided to the first page of the memory cell. In implementations, the remaining page of the memory cell programmed during the second programming pass can be programmed based on the corrected data that is provided to the first page and/or second page of the memory cell.

Figure 4A:
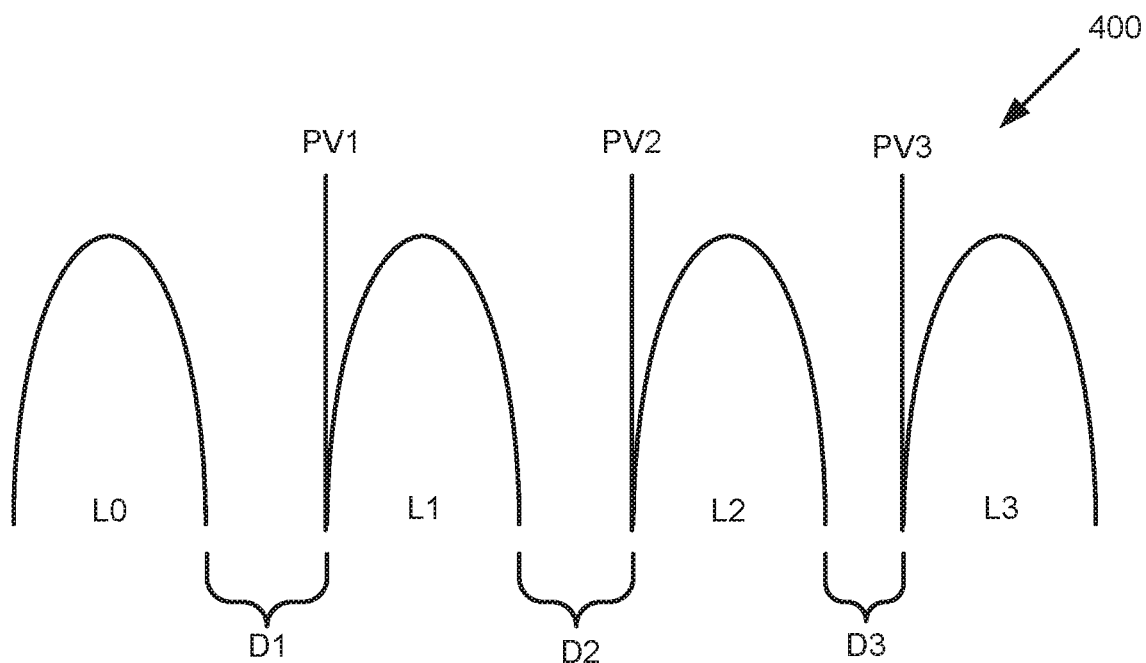
FIG. 4A illustrates an example of initial program verify voltages for levels of a memory cell in accordance with one embodiment of the present disclosure.

FIG. 4A illustrates an example of initial program verify voltages 400 for levels of a memory cell, in accordance with one embodiment of the present disclosure. As shown, a memory cell that stores two bits of data includes four levels L0, L1, L2, and L3 that can be programmed with three PV voltages (e.g., PV1 for L1, PV2 for L2 and PV3 for L3). In this example, the valley margin between L1 and L2 (D2) determines an expected error rate for data stored at a portion of the memory cell and the valley margin between L0 and L1 (D1) and L2 and L3 (D3) determine the error rate for data stored at another portion of the memory cell.

Figure 4B:
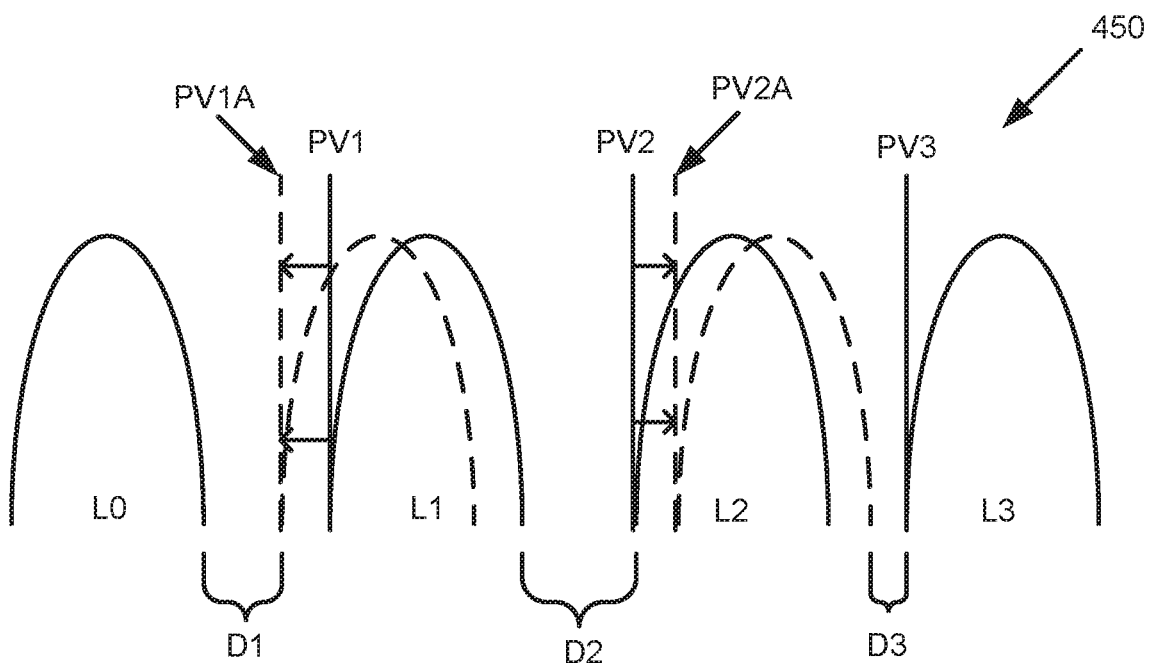
FIG. 4B illustrates an example of adjusting program verify voltages to increase or decrease the error rates of data stored at portions of the memory cell in accordance with some embodiments of the present disclosure.

FIG. 4B illustrates an example of adjusting program verify voltages 450 to increase or decrease the error rates of data stored at portions the memory cell, in accordance with some embodiments of the present disclosure. As shown, the error rate for the data stored at the portion of the memory cell is to be decreased so that the error rate for the data stored at the portion of the memory cell is less than the error rate for the data stored at the other portion of the memory cell. For example, PV2 can be shifted to the right (e.g., PV2A), which decreases the valley margin D3 between shifted L2 and L3 while also increasing the valley margin D2 between L1 and L2. The result is a decrease in the error rate associated with the data stored at the portion of the memory cell by increasing the distance D2 associated with data stored at the first portion of the memory cell. Furthermore, the expected error rate associated with the data stored at the other portion of the memory cell is increased by decreasing the distance D3 associated with the error rate for data stored at the second portion of the memory cell.

In another example, PV1 can be shifted to the left (e.g., PV1A), which decreases valley margin D1 between shifted L1 and L0 and increases distance D2 valley margin shifted L1 and L2. This results in a decrease in the error rate associated with the data stored at the portion of the memory cell by increasing the distance D2 associated with data stored at the portion of the memory cell. Furthermore, the error rate associated with the data stored at the other portion of the memory cell is increased by decreasing the distance D1 associated with the error rate for data stored at the other portion of the memory cell.

Figure 5A:
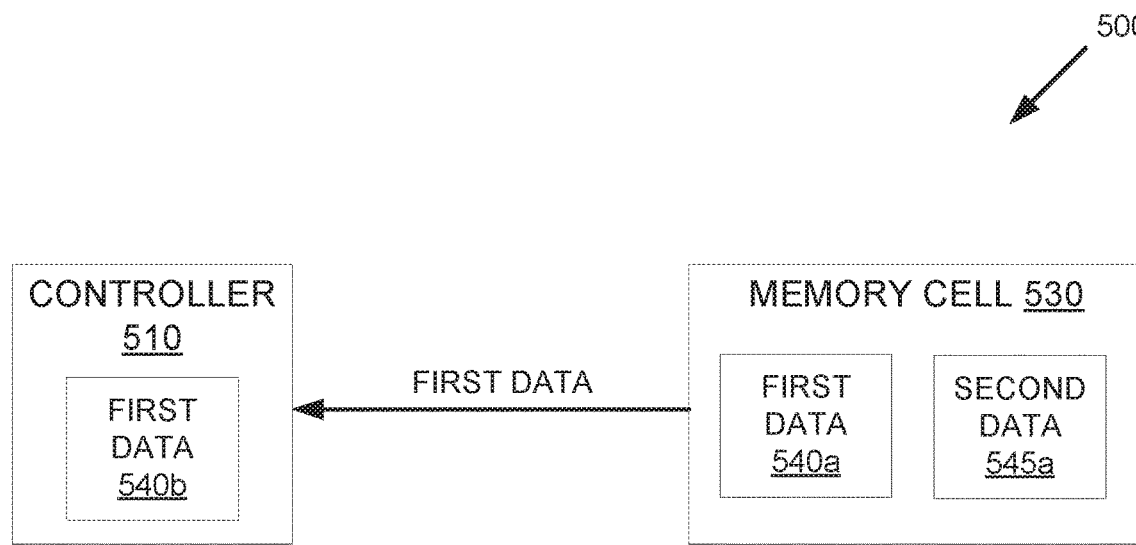
FIG. 5A illustrates an example of providing data from a memory cell of a memory system based on an adjustable error rate in accordance with some embodiments of the present disclosure.

FIG. 5A illustrates an example of providing data from a memory cell of a memory system 500 based on an adjustable error rate, in accordance with some embodiments of the present disclosure. The memory system 500 includes a memory cell 530 and a controller 510 that corresponds to controller 111 of FIG. 1. Although the present illustration discusses providing data to a controller of the memory system based on an adjustable error rate, in other embodiments the data can be provided to other components of the computing environment 100 of FIG. 1. For example, the data can be provided to host system 120 of FIG. 1 so that the host system can provide the error correction for the data. The memory cell 530 can include first data 540a stored at a first portion (e.g., the first page) of the memory cell 530 and second data 545a stored at a second portion (e.g., the second page) of the memory cell 530. As previously discussed, a read operation can be performed on memory cell 530 as part of a first programming pass of a two-pass programming process. During the read operation, first data 540b can be provided to controller 510. First data 540b can be a copy of first data 540a read from memory cell 530. Upon receiving the first data 540b, the memory system can determine whether a first error rate associated with the first data 540b exceeds a threshold when a controller 510 performs an error correction operation on first data 540b.

Figure 5B:
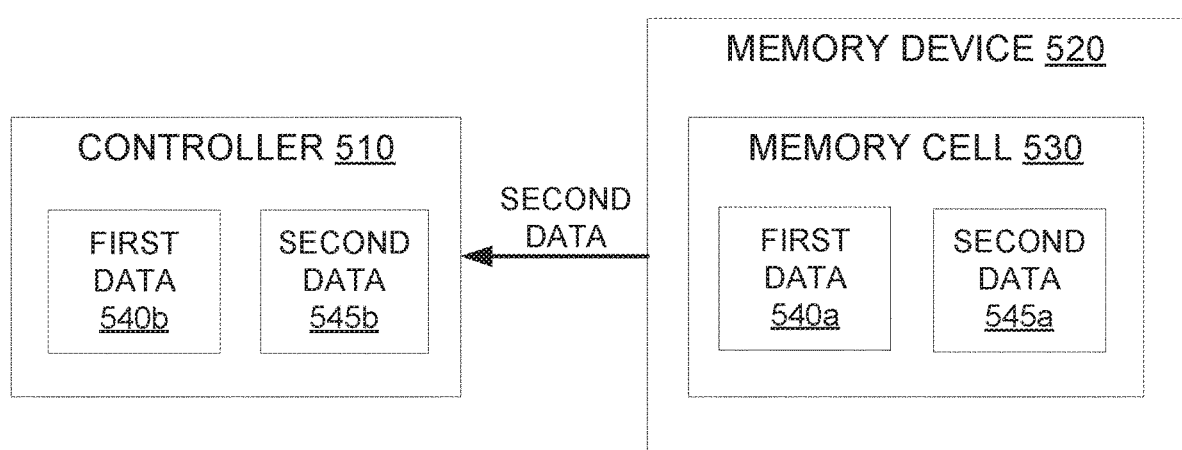
FIG. 5B illustrates an example of providing additional data of the memory system based on an adjustable error rate in accordance with some embodiments of the present disclosure.

FIG. 5B illustrates an example of providing additional data of the memory cell of the memory system, in accordance with some embodiments of the present disclosure. If the first error rate associated with first data 540b exceeds a threshold, then second data 545b is read from a memory device 520 associated with memory cell 530 to controller 510. Upon receipt of second data 545b, the controller 510 determines whether second data 545b includes any errors. If controller 510 determines that second data 545b includes errors, then controller 510 can perform an error correction operation on second data 545b. The controller provides corrected first data and/or second data to memory cell 530. For example, the corrected first data can be provided to the first page of the memory cell and/or the corrected second data can be provided to the second page of the memory cell. In some implementations, controller 510 can determine that first data 540b and/or second data 545b do not include any errors. Accordingly, the controller 510 can provide first data 540b and/or second data 545b to memory cell 530 to refresh the portions of the data stored at memory cell 530.

Figure 6:
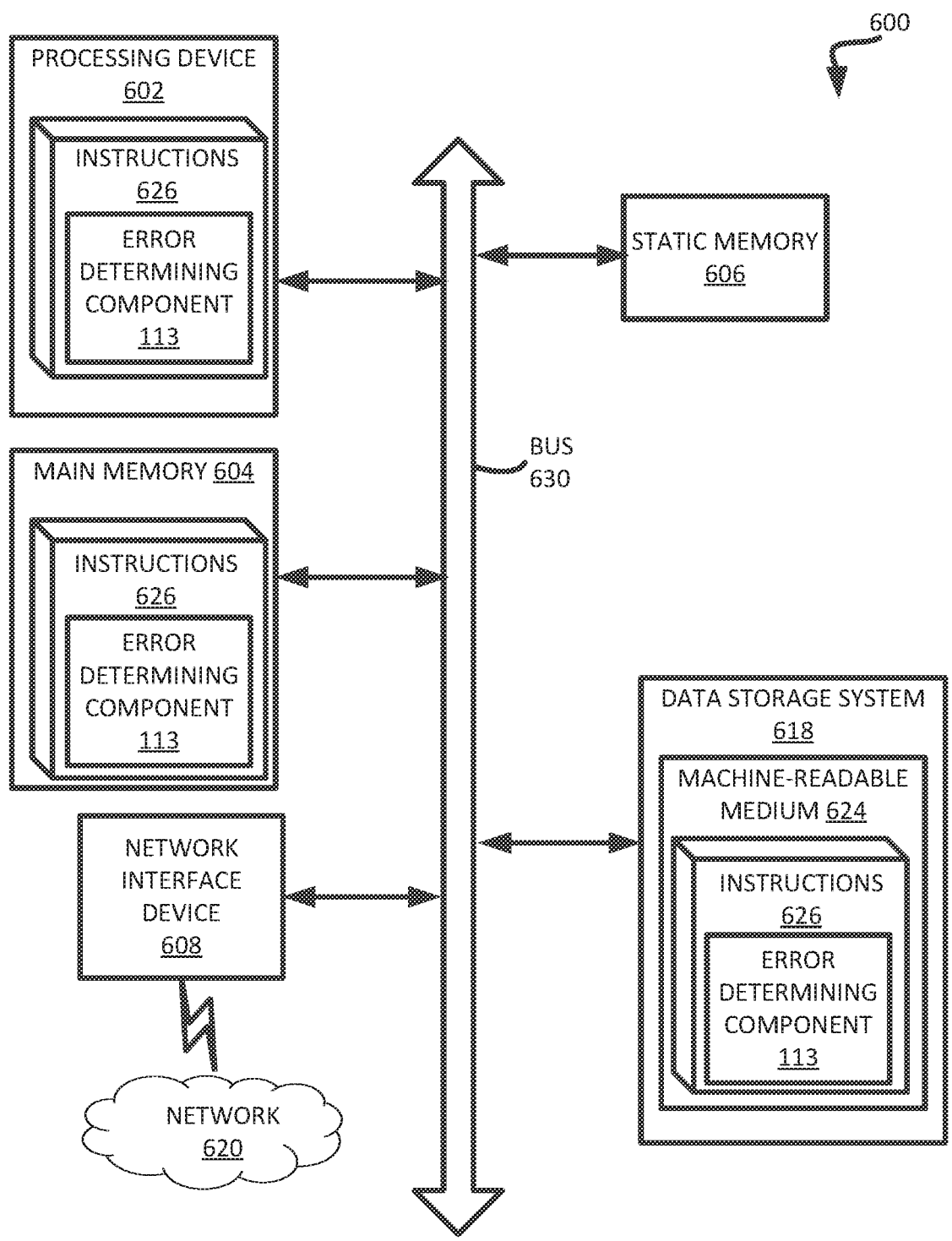
FIG. 6 is a block diagram of an example computer system in which implementations of the present disclosure may operate.

FIG. 6 illustrates an example machine of a computer system 600 within which a set of instructions, for causing the machine to perform any one or more of the methodologies discussed herein, may be executed. For example, the computer system 600 may correspond to a host system (e.g., the host system 120 of FIG. 1) that includes or utilizes a memory system (e.g., the memory system 110 of FIG. 1) or may be used to perform the operations of a controller (e.g., to execute an operating system to perform operations corresponding to the error determining component 113 of FIG. 1). In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device may be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 may further include a network interface device 608 to communicate over the network 620.

The data storage system 618 may include a machine-readable storage medium 624 (also known as a computer-readable medium) on which is stored one or more sets of instructions or software 626 embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 may correspond to the memory system 110 of FIG. 1.

In one implementation, the instructions 626 include instructions to implement functionality corresponding to an error determining component (e.g., error determining component 113 of FIG. 1). While the machine-readable storage medium 624 is shown in an example implementation to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure may refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus may be specially constructed for the intended purposes, or it may include a general purpose computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems may be used with programs in accordance with the teachings herein, or it may prove convenient to construct a more specialized apparatus to perform the method. The structure for a variety of these systems will appear as set forth in the description below. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, implementations of the disclosure have been described with reference to specific example implementations thereof. It will be evident that various modifications may be made thereto without departing from the broader spirit and scope of implementations of the disclosure as set forth in the following claims. The specification and drawings are, accordingly, to be regarded in an illustrative sense rather than a restrictive sense.

What is claimed is:

1. A system comprising:
   a memory device; and
   a processing device, operatively coupled with the memory device, to:
   identify a first data stored at a first portion of a memory cell and a second data stored at a second portion of the memory cell;
   determine a first error rate associated with the first data stored at the first portion of the memory cell, the first error rate being adjusted to exceed a second error rate associated with the second data stored at the second portion of the memory cell;
   determine whether the first error rate exceeds a threshold; and
   in response to determining that the first error rate exceeds the threshold, provide the second data stored at the second portion of the memory cell for use in an error correction operation by a controller associated with the memory cell.

2. The system of claim 1, wherein the processing device is further to:
   perform the error correction operation on the second data stored at the second portion of the memory cell; and
   provide the corrected second data to the second portion of the memory cell.

3. The system of claim 2, wherein the corrected second data is provided to the second portion of the memory cell during a second programming operation performed on the memory cell.

4. The system of claim 1, wherein the first error rate associated with the first data stored at the first portion of the memory cell is based on a first programming operation performed on the memory cell.

5. The system of claim 1, wherein the processing device is further to:
   perform a read operation on the first data stored at the first portion of the memory cell; and
   provide the first data stored at the first portion of the memory cell to the controller associated with the memory cell, wherein determining whether the first error rate exceeds the threshold is based on providing the first data stored at the first portion of the memory cell to the controller associated with the memory cell.

6. The system of claim 1, wherein to determine the first error rate associated with the first data stored at the first portion of the memory cell, the processing device is further to:
   adjust the first error rate associated with the first data stored at the first portion of the memory cell by modifying one or more program voltages associated with the first data stored at the first portion of the memory cell.

7. The system of claim 6, wherein to adjust the first error rate associated with the first data stored at the first portion of the memory cell, the processing device is further to modify the one or more program voltages to increase a subsequent first error rate, and wherein the modifying the one or more program voltages to increase the subsequent first error rate corresponds to a decrease in a subsequent second error rate associated with the second data stored at the second portion of the memory cell.

8. A method comprising:
   identifying a first data stored at a first portion of a memory cell and a second data stored at a second portion of the memory cell;
   determining a first error rate associated with the first data stored at the first portion of the memory cell, the first error rate being adjusted to exceed a second error rate associated with the second data stored at the second portion of the memory cell;
   determining whether the first error rate exceeds a threshold; and
   in response to determining that the first error rate exceeds the threshold, providing, by a processing device, the second data stored at the second portion of the memory cell for use in an error correction operation by a controller associated with the memory cell.

9. The method of claim 8, further comprising:
   performing the error correction operation on the second data stored at the second portion of the memory cell; and
   providing the corrected second data to the second portion of the memory cell.

10. The method of claim 9, wherein the corrected second data is provided to the second portion of the memory cell during a second programming operation performed on the memory cell.

11. The method of claim 8, wherein the first error rate associated with the first data stored at the first portion of the memory cell is based on a first programming operation performed on the memory cell.

12. The method of claim 8, further comprising:
performing a read operation on the first data stored at the first portion of the memory cell; and
providing the first data stored at the first portion of the memory cell to the controller associated with the memory cell, wherein determining whether the first error rate exceeds the threshold is based on providing the first data stored at the first portion of the memory cell to the controller associated with the memory cell.

13. The method of claim 8, wherein determining the first error rate associated with the first data stored at the first portion of the memory cell further comprises:
adjusting the first error rate associated with the first data stored at the first portion of the memory cell by modifying one or more program voltages associated with the first data stored at the first portion of the memory cell.

14. The method of claim 13, wherein adjusting the first error rate associated with the first data stored at the first portion of the memory cell further comprises modifying the one or more program voltages to increase a subsequent first error rate, and wherein the modifying the one or more program voltages to increase the subsequent first error rate corresponds to a decrease in a subsequent second error rate associated with the second data stored at the second portion of the memory cell.

15. A non-transitory computer-readable storage medium comprising instructions that, when executed by a processing device, cause the processing device to:
identify a first data stored at a first portion of a memory cell and a second data stored at a second portion of the memory cell;
determine a first error rate associated with the first data stored at the first portion of the memory cell, the first error rate being adjusted to exceed a second error rate associated with the second data stored at the second portion of the memory cell;
determine whether the first error rate exceeds a threshold; and
in response to determining that the first error rate exceeds the threshold, provide the second data stored at the second portion of the memory cell for use in an error correction operation by a controller associated with the memory cell.

16. The non-transitory computer-readable storage medium of claim 15, wherein the processing device is further to:
perform the error correction operation on the second data stored at the second portion of the memory cell; and
provide the corrected second data to the second portion of the memory cell.

17. The non-transitory computer-readable storage medium of claim 16, wherein the corrected second data is provided to the second portion of the memory cell during a second programming operation performed on the memory cell.

18. The non-transitory computer-readable storage medium of claim 15, wherein the first error rate associated with the first data stored at the first portion of the memory cell is based on a first programming operation performed on the memory cell.

19. The non-transitory computer-readable storage medium of claim 15, wherein to determine the first error rate associated with the first data stored at the first portion of the memory cell, the processing device is further to:
adjust the first error rate associated with the first data stored at the first portion of the memory cell by modifying one or more program voltages associated with the first data stored at the first portion of the memory cell.

20. The non-transitory computer-readable storage medium of claim 19, wherein to adjust the first error rate associated with the first data stored at the first portion of the memory cell, the processing device is further to modify the one or more program voltages to increase a subsequent first error rate, and wherein the modifying the one or more program voltages to increase the subsequent first error rate corresponds to a decrease in a subsequent second error rate associated with the second data stored at the second portion of the memory cell.

21. The non-transitory computer-readable storage medium of claim 15, wherein the processing device is further to:
in response to determining that the first error rate exceeds the threshold, provide third data stored at a third portion of the memory cell to the controller associated with the memory cell.

* * * * *